United States Patent [19]

Harding

[11] Patent Number: 4,855,868

[45] Date of Patent: Aug. 8, 1989

[54] PREFORMED PACKAGING ARRANGEMENT FOR ENERGY DISSIPATING DEVICES

[76] Inventor: Ade'yemi S. K. Harding, 12513 Hunters Chase Dr., Austin, Tex. 78729

[21] Appl. No.: 75,642

[22] Filed: Jul. 20, 1987

Related U.S. Application Data

[63] Continuation-in-part of Ser. No. 4,710, Jan. 20, 1987.

[51] Int. Cl.[4] .............................................. H05K 7/20
[52] U.S. Cl. ..................................... 361/386; 29/841; 174/52.2
[58] Field of Search ............ 174/52 FP, 52 R, 52 PE; 361/386; 357/81; 29/841

[56] References Cited

U.S. PATENT DOCUMENTS

| | | | |
|---|---|---|---|
| 3,585,455 | 6/1971 | Naylor | 361/407 |
| 4,004,195 | 1/1977 | Harayda et al. | 174/52 FP X |
| 4,235,285 | 11/1980 | Johnson et al. | 357/81 |
| 4,524,238 | 6/1985 | Butt | 174/52 FP |
| 4,618,739 | 10/1986 | Theobald | 174/52 FP |
| 4,621,304 | 11/1986 | Oogaki et al. | 361/386 |
| 4,629,824 | 12/1986 | Gilder, Jr. et al. | 174/52 FP |
| 4,692,561 | 9/1987 | Nattel | 174/65 SS |
| 4,701,999 | 10/1987 | Palmer | 174/52 FP |
| 4,715,115 | 12/1987 | King et al. | 29/84 F |
| 4,751,611 | 6/1988 | Arai et al. | 361/421 |

FOREIGN PATENT DOCUMENTS 59-207646 11/1984 Japan .

Primary Examiner—A. D. Pellinen
Assistant Examiner—Morris Ginsburg
Attorney, Agent, or Firm—Barnes & Thornburg

[57] ABSTRACT

A packaging arrangement for energy dissipating devices includes thermal elements adjacent first and second sides of the device, and a heat-flow modifier adjacent the thermal element for regulating the flow of heat therefrom. A plurality of electrically conductive leads extend from the device to the exterior of the packaging arrangement. Portions of the electrically conductive leads extend between the thermal elements and are in thermal contact with at least one of these elements. The leads are electrically isolated from the thermal elements and a seal is maintained between the leads and the elements. An outer casing surrounds the thermal elements, and the plurality of leads extend through the outer casing to provide for connecting the device to the environment. A seal is also maintained between the outer casing and the leads. The outer casing is formed from premolded thermoplastic base and cap sections. The thermal elements and heat-flow modifiers are preferably integrally formed with the base and cap by an injection molding technique. In one embodiment, an elastomeric seal is formed on a leadframe, the leadframe/seal assembly is molded to a preformed base section of a thermoplastic housing, a thermal element is positioned on the housing adjacent the device and a portion of the leadframe, and a cap section of the housing is molded to the base and/or the leadframe/seal assembly to complete the housing.

9 Claims, 3 Drawing Sheets

PREFORMED PACKAGING ARRANGEMENT FOR ENERGY DISSIPATING DEVICES

BACKGROUND AND SUMMARY OF THE INVENTION

This is a continuation-in-part application of U.S. Ser. No. 004,710, filed Jan. 20, 1987, entitled "Packaging Arrangement for Energy Dissipating Devices."

This invention relates generally to packaging arrangements for energy dissipating devices and, more specifically, to a packaging arrangement having improved thermal characteristics, heightened resistance to the penetration of moisture, and reduced thermomechanical stressing. The arrangement of the present invention is especially well-suited for packaging electrical, electronic and microelectronic components, and can be used with single components, multiple components, or complete circuits (e.g., printed circuit boards).

The use of plastic encapsulation as a packaging technique for electronic devices is well known. Problems of corrosion and inadequate thermal performance have been noted in plastic encapsulated devices. More recently, with the advent of Very Large Scale Integrated (VLSI) Technology, the additional problem of thermo-mechanical stressing has arisen as a major concern to packaging designers.

Consideration of plastic encapsulation techniques currently in use raises questions as to the basic soundness of this packaging method for all applications. The Transfer Molding Process commonly used allows molten plastic to flow around and past the device and the delicate bond wires, before eventual cross-linking and cure. The close contact between the somewhat delicate circuitry on the device and the encapsulant does not appear to be as benign as was once presumed. Furthermore, the adhesion at the plastic/leadframe interface has always been a source of concern, as has the relatively poor thermal performance of the package which results from the forced reliance on the low thermal conductivity plastic for transporting the major portion of energy dissipated at the device. Consideration of these problems reveals the need to identify more effective techniques for protecting the subject device both during and after completion of the packaging process, and for transferring heat from the packaged device to its environment.

An object of the present invention is to provide a packaging arrangement for energy dissipating devices which has improved thermal characteristics.

Another object of the present invention is to provide a packaging arrangement for energy dissipating devices which offers a greater degree of mechanical protection for the packaged device and associated connections.

Yet another object of the present invention is to provide a packaging arrangement for energy dissipating devices which is especially well-suited for use with preformed thermoplastic packaging elements which are used to form an outer shell or casing around the packaged device.

Still another object of the present invention is to provide a packaging arrangement for energy dissipating devices which incorporates thermal elements which are specially designed, or which can be easily modified or adjusted, to regulate the transfer or flow of heat from the packaged device.

Still another object of the present invention is to provide a packaging arrangement for energy dissipating devices in which the thermal elements used to regulate heat transfer from the device form a sealed inner enclosure around the device to provide increased mechanical protection of the device and to reduce the migration of moisture from the environment to the area immediately surrounding the device.

Still another object of the present invention is to provide a packaging arrangement for energy dissipating devices which includes one or more heat-flow modifiers placed within the package to control the heat flow rates in major flow paths so as to optimize the thermal performance of the package for given sets of operating conditions.

Still another object of the present invention is to provide a packaging arrangement for electronic devices which is especially well-suited for use with high pin count devices.

These and other objects of the invention are attained in a packaging arrangement which comprises first and second thermal elements extending in generally planar directions adjacent respective first and second sides of the energy dissipating device, a plurality of electrically conductive leads extending from the device to the exterior of the packaging arrangement, means for electrically isolating the leads from the thermal elements and for effecting a seal between the leads and thermal elements, an outer casing surrounding the first and second thermal elements, and means for effecting a seal between the outer casing and the leads. At least one of the first and second thermal elements is in thermal communication with the packaged device. The plurality of leads extend between the first and second thermal elements, and at least one of the elements extends adjacent a portion of the leads and is in thermal communication with these lead portions. The leads extend through the outer casing to the device environment.

A preferred embodiment of the present invention further comprises a heat-flow modifying element adjacent at least one of the first and second thermal elements for regulating the flow of heat therefrom. In an especially preferred embodiment of the invention, the thermal conductivity of the heat-flow modifier may be adjusted or varied, depending upon internal and external operating conditions. The modifier may comprise a metallic element. One or more openings or channels may be provided in the element to accommodate a heat flow regulating medium. Alternatively, the heat-flow modifier may comprise a cavity of specified dimensions. The cavity may be left empty so as to form an air gap, or may be filled with a heat flow regulating substance (e.g., an expanded foam) to provide the required thermal resistance necessary for optimal energy distribution in the arrangement. At least a portion of an interior surface of the cavity may be lined with a thin metal foil to provide resistance to moisture penetration of the cavity.

In a preferred embodiment of the invention, a portion of the second thermal element contains a material having a high energy of transformation from solid to liquid, which portion is situated in close proximity to a surface of the packaged device. The portion of the second thermal element close to electrically active regions of the device will be coated with a thin semiconductor grade dielectric material for assured electrical isolation. Alternatively, the second thermal element may comprise a metallic sheet and a thermally conductive, electrically insulating elastomeric material disposed between the sheet and the device. The elastomeric material preferably includes an outer, relatively rigid elastomeric crust and an inner, relatively soft elastomeric core.

In an especially preferred embodiment, the thermal elements substantially surround the device to form an inner casing or enclosure around the device to provide a degree of mechanical protection and to inhibit the transport of moisture from the package environment to the area immediately surrounding the device. The outer casing may be formed by an encapsulating technique, but is preferably preformed of a thermoplastic material in at least two sections, including a base and a cap. In this embodiment, one of the thermal elements is mounted in, or formed integrally with, the base section of the outer casing, while the other thermal element is similarly mounted in or formed with the cap section of the casing. After the device is mounted in the base section and appropriate connections are made, the base and cap sections are sealed together to form the completed package. The base and cap may be sealed by a fusion bonding technique, or by injecting a molten thermoplastic material into a joint formed by adjacent surfaces of the base and cap.

In yet another especially preferred embodiment of the invention, a seal between the outer casing and the leads is formed by a seal assembly which comprises a relatively soft, inner elastomeric core surrounding each respective lead, and a relatively rigid, outer elastomeric crust substantially surrounding the relatively soft inner core. The seal assembly is compressed and heat cured in situ, after which the base and cap are joined so as to establish a tight seal around each lead.

The means for electrically insulating the leads from the thermal elements preferably includes a thermoplastic material or preformed film disposed between the leads and the thermal elements. When the preformed encasement technique is used, the thermoplastic film or material is preferably formed from a thermoplastic which is the same as or compatible with the thermoplastic used to form the base and cap sections of the outer casing so that at least some bonding will occur between the film or material and one or both of these sections when the package casing is formed and the package is sealed.

Other objects, advantages and novel features of the present invention will become apparent from the following detailed description of the invention when considered in conjunction with the accompanying drawings.

DETAILED DESCRIPTION OF THE DRAWINGS

Figure 1:
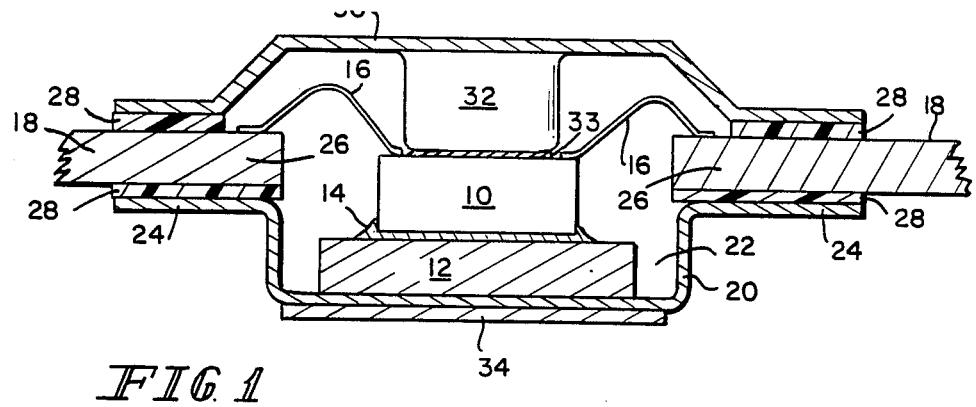
FIG. 1 is a sectional view of an embodiment of the packaging arrangement of the present invention, shown without an outer casing.

FIG. 1 shows an embodiment of the present invention which includes an electronic device 10 mounted on a metallic pad 12 with a bonding material 14 which, for example, may be a silver-filled epoxy. Bond wires 16 connect respective bond pads on device 10 to a plurality of leads, represented by the two leads 18 in FIG. 1, which provide means for connecting device 10 to the external environment. Immediately adjacent the device/metallic pad combination is a thermal element designated by reference numeral 20. Thermal element 20 is, in this embodiment of the invention, a thin metallic sheet which is U-shaped in cross-section and which forms a recess 22 for receiving the device/metallic pad combination. Metallic pad 12 is mounted to thermal element 20 so as to insure good thermal contact between thermal element 20 and device 10. Although metallic pad 12 is incorporated in the arrangements shown in FIGS. 1 and 2, its use may not be necessary in every instance and its inclusion or omission has no effect on the practicing of the present invention. The outer ends 24 of thermal element 20 extend for a distance immediately adjacent to respective end portions 26 of the representative leads 18. Outer ends 24 of thermal element 20 are electrically isolated from the leads by, for example, a thermoplastic tape or film 28 having a high electrical resistance. However, outer ends 24 are in thermal contact with end portions 26 of leads 18.

A second thermal element 30 is positioned above device 10 and leads 18. Thermal element 30 is also preferably formed of a thin metallic foil plate which is electrically isolated from, but in thermal contact with, end portions 26 of leads 18 in the same manner as was previously described in connection with thermal element 20. The cross-sectional shape of thermal element 20 may vary in accordance with design requirements. For example, the center portion of thermal element 30 may be shaped as illustrated at 32 in FIG. 1 so as to establish good thermal contact with device 10. In this case, a surface of portion 32 of thermal element 30 will be in very close proximity to the top surface of device 10, but will be separated from that surface by, for example, a thin layer of semiconductor grade thermally conductive gel 33. This portion of thermal element 30 may also be designed to contain a material having a high energy of transformation from solid to liquid to modify the heat dissipating characteristics of the arrangement.

The remaining component in the arrangement shown in FIG. 1 is a heat-flow modifying element 34 which is shown positioned immediately adjacent a portion of thermal element 20. Element 34 may take a variety of forms. For example, element 34 may be a metallic element used to establish thermal contact between thermal element 20 and external heat dissipating structures. Alternatively, element 34 may take the form of a relatively thick metallic body provided with channels to accommodate the flow of a heat regulating fluid (see FIG. 2). As another alternative, element 34 may comprise an air gap of specified dimensions (See FIG. 3). Numerous other forms are possible and the use of more than one heat-flow modifier adjacent either of thermal elements 20 or 30 is considered to be within the scope of the present invention.

If the outer ends of thermal elements 20 and 30 are adequately sealed around the end portions of the leads, the embodiment shown in FIG. 1 represents a workable packaging arrangement for device 10. Thermal elements 20 and 30 distribute the energy dissipated by device 10 in a relatively uniform manner over as large a plane as might be practically allowed by overall size considerations. By virtue of their thermal contact with the end portions of the leads, elements 20 and 30 provide for good thermal communication between the leads and device 10, making possible the establishment of high uniform lead temperatures. Maintaining the highest possible lead temperatures is important to achieving the maximum thermal performance of the metallic leadframe in many packaging arrangements, and elements 20 and 30 contribute toward this end in the packaging arrangement of the present invention.

Although the arrangement shown in FIG. 1 might conceivably be used as a "complete" packaging arrangement, the further provision of an outer casing of a material such as a thermoplastic is preferred. The outer casing will preferably completely surround thermal elements 20 and 30, and a seal will be formed between the outer casing and the leads where the leads extend through the casing to provide an external connection point. If a plastic encapsulation technique is used to form the outer casing, thermal elements 20 and 30 serve to form an inner enclosure around device 10, thus protecting the device and delicate bond wires from contact with the plastic encapsulant. Other advantages to such an arrangement include: the establishment of a relatively constant planar temperature distribution along the planes of the thermal elements and improved energy transport out of the package; the establishment of high lead temperatures with the potential for reducing moisture ingress along the plastic/lead interfaces; and thermal elements 20 and 30 act as a barrier to moisture transport directly through the plastic to the device. Such an arrangement provides a unified approach to the problems of corrosion, thermal performance, and thermo-mechanical stressing known to exist in devices packaged by conventional encapsulation techniques.

Figure 2:
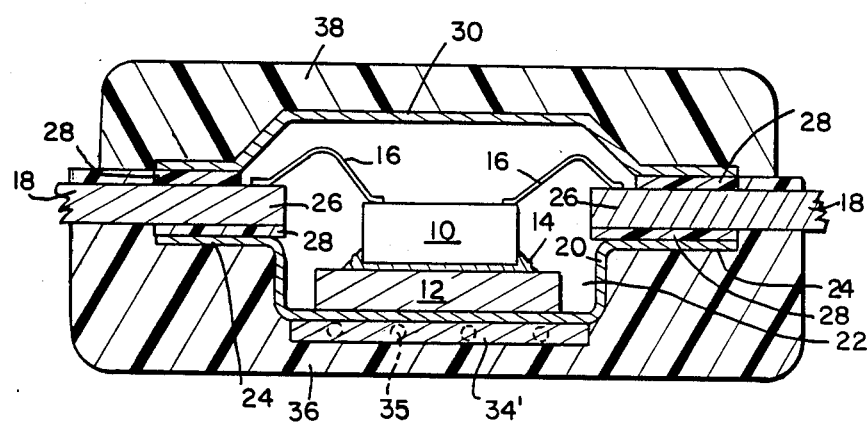
FIG. 2 is a sectional view of an embodiment of the present invention which includes a micro-electronic device, associated thermal elements and heat-flow modifier, and an outer thermoplastic casing.

Although the arrangement illustrated in FIG. 1 can be encapsulated to provide an improved packaging arrangement, an outer casing formed by a premolded encasement technique, incorporating the features discussed above, is preferred. Such an arrangement is illustrated in FIG. 2. To the extent possible, like reference numerals are used to identify components in FIG. 2 which were previously discussed in connection with FIG. 1. Depending portion 32 of thermal element 30 is not shown in the embodiment illustrated in FIG. 2. Reference numeral 34 of FIG. 1 has been changed to 34' in FIG. 2 since a modified version of the heat-flow modifying element is shown in FIG. 2. This modified version illustrates the provision of channels 35 (represented by dashed lines) in the heat-flow modifying element to allow for modification and/or enhancement of the thermal characteristics of the modifying element by, for example, providing for the flow of a heat regulating fluid or medium through the channels.

The outer casing illustrated in FIG. 2 comprises a two part injection molded package which includes a base 36 and cap 38. These components are separately molded by injection molding techniques which preferably allow element 34' and thermal element 20 to become an integral part of base 36, while thermal element 30 becomes an integral part of cap 38. Assembly of the entire arrangement illustrated in FIG. 2 then involves mounting the leadframe and pad 12 in base 36, molding the housing around the frame, mounting device 10 on pad 12, forming the appropriate connections between device 10 and leads 18, properly positioning cap 38 on base 36, and sealing cap 38 to base 36. The advantages provided by thermal elements 20 and 30 and modifying element 34', as previously discussed in connection with FIG. 1, are applicable in the arrangement illustrated in FIG. 2.

Figure 3:
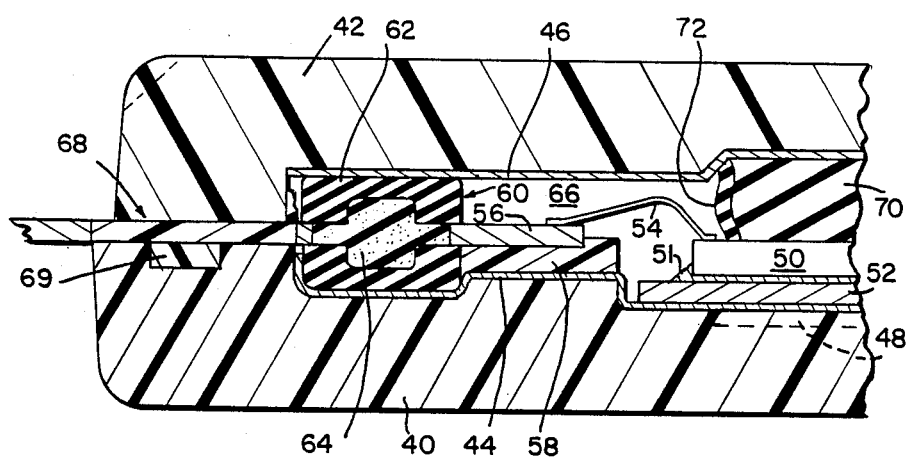
FIG. 3 is a partial sectional view of another embodiment of the present invention showing details associated with establishing a seal around the micro-electronic device.

FIG. 3 shows a partial sectional view of another embodiment of the invention in which additional details of the seals between the base and the cap and between the leads and the thermal elements are shown. FIG. 3 includes base 40 and cap 42 which are preformed of a thermoplastic material. Integrally molded with base 40 is a metallic thermal element 44. In like fashion, thermal element 46 is integrally molded with cap 42. Heat-flow modifier 48 in this embodiment comprises an air gap of specific dimensions located immediately adjacent the underside of thermal element 44 near the center of the package. The size of the gap determines its effect on the heat transport performance of the surrounding package elements. The size and location of thermal element 44 and heat-flow modifier 48 may be altered, as desired, due to the flexibility of the injection molding process used to form the base and cap. Also in the center of the package is device 50 which is mounted by silver-filled epoxy 51 to metallic pad 52. Pad 52 is, in turn, mounted in good thermal contact to the top side of thermal element 44. As with the other embodiments illustrated in the Drawings, device 50 could be mounted directly to thermal element 44, if desired, since element 44 provides a suitable substrate for mounting of the device.

Bonding pads on device 50 are connected by bond wires 54 to leads 56 which extend to the external environment. In FIG. 3, lead 56 is electrically insulated from thermal element 44 by a thermoplastic film 58 which is fusion-bonded to lead 56, and a compressed elastomeric seal assembly 60. Seal assembly 60, which is mounted on the leadframe, comprises an outer elastomeric crust 62, within which is cast a softer B-Stageable elastomer 64. When cap 42 is assembled to base 40, outer crust 62 of seal assembly 60 is compressed by thermal elements 44 and 46 to provide for maintenance of a tight seal between these elements and around each lead. As previously noted, the sealed thermal elements form an interior enclosure (generally indicated by reference numeral 66 in FIG. 3) around device 50, bond wires 54, and other internal components of the package. Seal assembly 60 preferably extends around the entire periphery of the interior enclosure formed by the thermal elements.

In the embodiment of FIG. 3, base 40 and cap 42 are sealed and bonded to each other in the area generally designated 68 (i.e., external to seal assembly 60) by an induction heating technique. This fusion bonded seal extends around the entire perimeter of the package.

Rectangular portion 69 of base 40, which is located immediately adjacent lead 56, is initially a trough formed during the injection molding of base 40. A complementary projecting tongue is likewise formed on cap 42 during the injection molding process. When cap 42 and base 40 are sealed, the tongue melts to fill the trough so as to enhance the characteristics of the bond formed between base 40 and cap 42 during the induction heating and subsequent fusion of materials forming these two elements.

An additional feature of the embodiment of the invention shown in FIG. 3 is the use of a thermally conductive, electrically insulating elastomer 70 which is cast on the underside of thermal element 46 immediately over device 50. Elastomer 70 is a relatively soft compound which is encircled on its vertical edges by a relatively firm outer elastomeric crust 72. The area of device 50 which is in actual contact with elastomer 70 is somewhat restricted by bonding wire considerations, but nevertheless provides adequate means for the effective transport of heat to thermal element 46. As previously mentioned in connection with FIG. 1, this arrangement for increasing thermal energy transport from the device to the upper thermal element is only one of many possible configurations.

Figure 4:
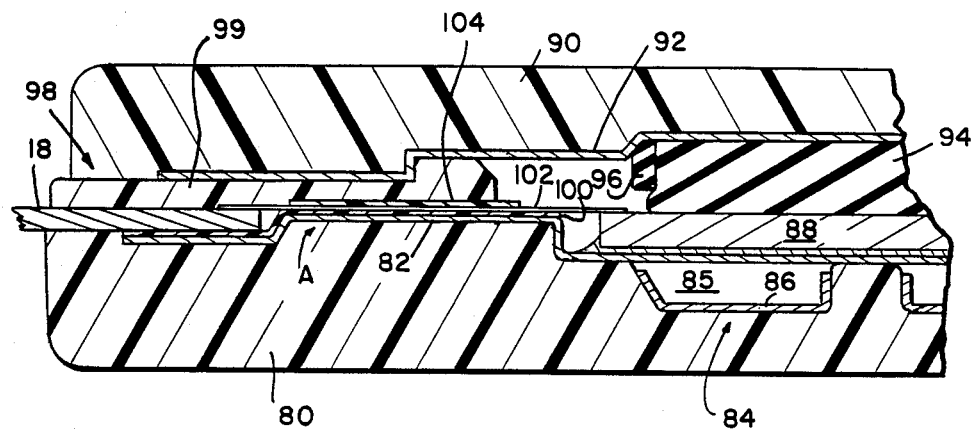
FIG. 4 is a partial sectional view of another embodiment of the present invention showing encasement of a high pin count electronic device.

FIG. 4 shows an embodiment of the invention which is especially well-suited for use with electronic devices having a large number of leads (e.g., in excess of 84), maintained at center-to-center distances less than or equal to 25 thousands of an inch. For such high pin count devices, the leadframe material thickness decreases. For leadframe thicknesses on the order of 6 mils. (0.006 inches), leadframe design requirements force the size of a 200-pinout device to grow to approximately 0.460 inch per side for successful wire bonding. The encapsulation of such large devices with conventional techniques may result in problems related to device thermo-mechanical stressing which may be deleterious to device reliability and function. The embodiment shown in FIG. 4 employs the features of the present invention to reduce, or eliminate, these problems. The particular embodiment illustrated in FIG. 4 shows the present invention used in combination with a Tape Automated Bonding (TAB) technique of connecting the inner leads to the bonding pads of the device and the outer leads to the leads of the leadframe. The additional advantage derived from this arrangement relates to the relative ease and efficiency with which the leadframes can be manufactured since the lead-fingers of the frames terminate farther from the device where the spacing of individual lead-fingers is not as close. A similar arrangement can be designed using conventional wire bonding techniques.

The embodiment of FIG. 4 includes a preformed thermoplastic base 80, which is formed by injection molding and which includes an integrally molded metallic thermal element 82. Base 80 also includes a heat-flow modifying element 84 which includes one or more cavities 85 immediately adjacent the underside of thermal element 82. Cavity 85 may be filled with air, expanded foam, or other substances to give the required thermal resistance for optimal energy distribution throughout the package and to any underlying structures. A thin metallic foil 86 may be provided along the bottom and side walls of the cavity to provide resistance to moisture penetration and possible condensation. In this embodiment, device 88 is mounted (e.g., by silver filled epoxy) directly to the upper side of thermal element 82.

The embodiment of FIG. 4 further includes a preformed thermoplastic cap 90 having an integrally molded metallic thermal element 92 on its lower (interior) surface. A thermally conductive elastomeric compound 94, with a relatively rigid outer crust 96, is disposed between thermal element 92 and device 88. This embodiment of the packaging arrangement is sealed by an injection molding technique which involves injection of molten thermoplastic material between base 80 and cap 90. The area of the seal is generally represented by reference number 98 in FIG. 4. Such a sealing technique can also be used with the embodiment of the invention illustrated in FIG. 3.

Figure 5:
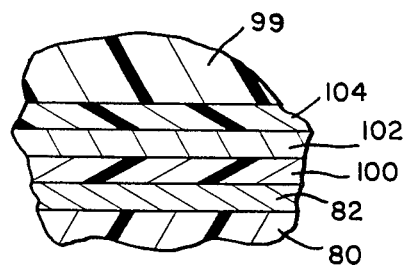
FIG. 5 is an enlarged sectional view of a portion of FIG. 4.

As previously noted, the connections from the various leads to the device bonding pads in FIG. 4 are established by a Tape Automated Bonding technique. FIG. 5 shows an enlarged cross-section of area A of Figure 4, illustrating the interrelationship between this technique and the packaging arrangement of the present invention. Moving from bottom to top, the various layers depicted in FIG. 5 include thermoplastic base 80, metallic thermal element 82, a first layer of thermoplastic film 100, a conductor layer or pattern 102 which may be deposited on thermoplastic film 100 by a metallizing technique, upper thermoplastic layer 104, and thermoplastic material 99 of the package housing base. In a preferred embodiment of this invention, thermoplastic film 104 and thermoplastic material 99 of the base are compatible so that fusion bonding occurs between these two elements when the base of the package housing is molded.

Figure 6:
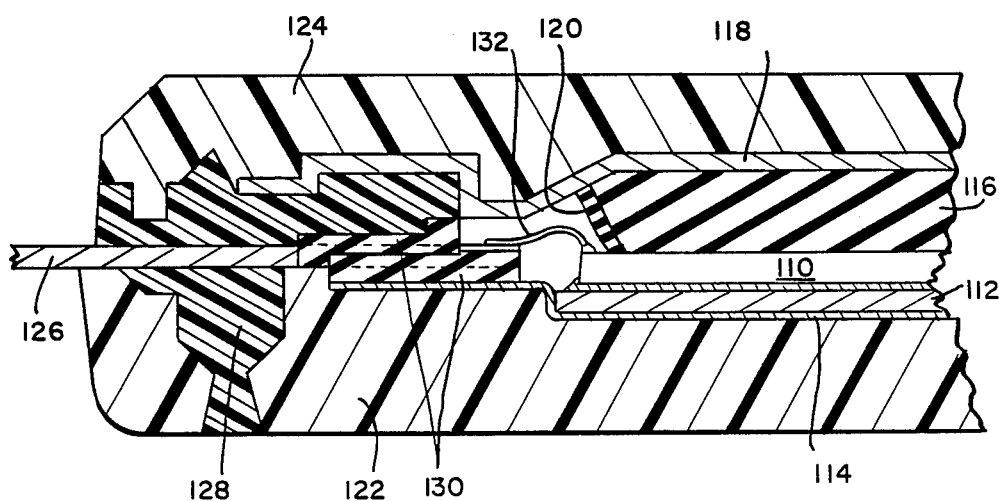
FIG. 6 is a sectional view of another embodiment of the packaging arrangement of the present invention.

FIG. 6 shows a modified embodiment of the present invention in which the seals established between the leadframe, the thermal elements, the base and/or the cap differ, in structure and sequence of manufacture, from those shown in the previously discussed embodiments. The embodiment of FIG. 6 shows a device 110 mounted on a metallic pad 112 which, in turn, is mounted to a lower thermal element 114. Immediately adjacent the top side of device 110 is a thermally conductive, electrically insulating elastomer 116 which is attached to the underside of upper thermal element 118. In this embodiment of the invention, upper thermal element 118 is approximately ten thousandths of an inch thick, while lower thermal element 114 is approximately two thousandths of an inch thick. As discussed in connection with the embodiment shown in FIG. 3 above, elastomer 116 is bounded by a relatively rigid outer crust 120.

The embodiment of FIG. 6 further includes a thermoplastic base 122 and cap 124 which together form the outer casing of the package. A plurality of leads 126 extend from the package and are sealed between base 122 and cap 124 by molded material 128 and by an elastomeric seal 130. Leads 126 are connected to the device by bond wires 132. In this embodiment, the leadframe is attached to base 122 by material 128 which is overmolded onto elastomeric sealing 130 and which encapsulates portions of the leads of the frame and fuses with base 122.

The preferred manufacturing sequence for the embodiment of FIG. 6 includes the following steps: mounting elastomeric seal 130 to the leadframe; mounting the frame and seal on the base and molding material 128 as shown to firmly attach the leadframe and seal to base 122; positioning thermal element 118, properly positioning the seal mold and molding cap 124 to seal the base/leadframe/seal assembly.

Elastomeric seal 130 is preferably made of two sections, as shown, which are placed on either side of the leadframe and then fully heat cured, under pressure, on the frame. Lower thermal element 114 is integrally molded to, or snap-fitted into position within, base 122 prior to final positioning of the leadframe and seal assembly. Molded material 128 preferably surrounds at least a portion of leads 126, extends into base 122, and extends over elastomeric seal 130 to bond all of these components together. Upper thermal element 118 is preferably snap-fitted into position atop the assembly prior to molding cap 124 and sealing cap 124 to base 122 and/or material 128.

Neither a thermal resistance air gap nor other heat flow modifying elements are shown in the embodiment of FIG. 6. These features could, of course, be added to this embodiment for the same reasons, and in a similar manner, as discussed in connection with FIGS. 1-4 above.

Although the invention has been described by reference to preferred embodiments relating to the packaging of an electronic device, other types of energy dissipating electrical devices can be packaged in accordance with the principles of the invention. It should also be noted that, although the invention has been described and illustrated in terms of a packaging arrangement for a single device, similar packaging arrangements for use with multiple devices and/or entire printed circuit boards can be devised and are considered to fall within the scope of this invention.

Although the invention has been described and illustrated in detail, it is to be clearly understood that the same is intended by way of illustration and example only and is not to be taken by way of limitation. The spirit and scope of the invention are to be limited only by the terms of the appended claims.

What is claimed is:

1. A method of packaging an energy dissipation device by thermoplastic encasement, comprising the steps of:
   a. forming a thermoplastic base;
   b. mounting a seal adjacent a plurality of leads of a leadframe to form a leadframe/seal assembly;
   c. positioning the leadframe/seal assembly on the base and securing the assembly to the base to form a housing for the device;
   d. mounting the device in the housing and forming connections between the device and the leads of the leadframe;
   e. positioning a thermal element on the housing adjacent the device and adjacent at least a portion of the leads of the leadframe such that said thermal element is in thermal communication with the device and the leadframe; and
   f. molding a thermoplastic cap on the housing to complete the encasement.

2. A method according to claim 1, wherein the step of securing the leadframe/seal assembly to the base includes molding a thermoplastic material to the base and around at least a portion of the leads of the leadframe and the seal.

3. A method according to claim 1, including the additional step of mounting a thermal element in the base.

4. A method according to claim 1 wherein the seal is a two-part seal, and wherein respective parts of the seal are placed on either side of the leadframe prior to curing the seal under pressure.

5. In combination with an energy dissipating device, a packaging arrangement comprising:
   a preformed thermoplastic base having means formed therein for receiving the energy dissipating device;
   a leadframe having a plurality of leads electrically connected to said device;
   at least one thermal element mounted inside the packaging arrangement adjacent the device and adjacent at least a portion of the leads of the leadframe so as to be in thermal communication with the device and leadframe;
   an elastomeric seal formed around the leads of the leadframe; and
   a cap molded to said base to form a sealed thermoplastic enclosure around the device.

6. The combination according to claim 5, further comprising a second thermal element adjacent the device and the cap, for regulating the transfer of heat from the device.

7. The combination according to claim 6, further comprising heat flow modifying means adjacent at least one of said first thermal element and second thermal element.

8. The combination according to claim 5, including means for mounting the leadframe and elastomeric seal to the preformed base including molded thermoplastic material.

9. The combination according to claim 5, wherein the elastomeric seal is a two-part seal and wherein respective parts of the seal are placed on either side of the leadframe prior to curing the seal under pressure.

* * * * *